United States Patent [19]

Oldfield

[11] Patent Number: 5,055,807
[45] Date of Patent: * Oct. 8, 1991

[54] METHOD AND APPARATUS FOR MULTIPLEXING BROAD BAND HIGH FREQUENCY SIGNALS FOR USE IN NETWORK ANALYZERS

[75] Inventor: William W. Oldfield, Redwood City, Calif.

[73] Assignee: Wiltron Company, Morgan Hill, Calif.

[*] Notice: The portion of the term of this patent subsequent to Oct. 1, 2008 has been disclaimed.

[21] Appl. No.: 294,882

[22] Filed: Jan. 9, 1989

[51] Int. Cl.$^5$ .............................................. H03H 7/46
[52] U.S. Cl. .................................... 333/110; 333/132; 333/134; 370/123
[58] Field of Search ................ 333/101, 110, 109, 117, 333/126, 129, 132, 134; 324/58 A, 58 B, 637; 370/57, 123

[56] References Cited

U.S. PATENT DOCUMENTS

| | | | |
|---|---|---|---|
| 3,423,675 | 1/1969 | Kraus et al. | 324/58 B |
| 4,061,990 | 12/1977 | Ueno | 333/111 X |
| 4,287,605 | 9/1981 | Dydyk | 333/110 X |
| 4,418,430 | 11/1983 | Halderman | 333/110 X |
| 4,605,902 | 8/1986 | Harrington | 333/109 X |
| 4,808,913 | 2/1989 | Grace | 333/109 X |

Primary Examiner—Eugene R. LaRoche
Assistant Examiner—Benny Lee
Attorney, Agent, or Firm—Fliesler, Dubb, Meyer & Lovejoy

[57] ABSTRACT

A method and apparatus for multiplexing broad band high frequency signals comprises a microwave coupler. A first source of signals is connected to the through-arm of the coupler and a second source of signals of higher frequency is connected to the coupling arm of the coupler. By using a coupler designed for operation at the frequencies of the signals from the second source, the loss of signal strength from the second source is significantly reduced while the loss of signal strength from the first source is only slightly greater than that incurred in prior known multiplexer.

13 Claims, 4 Drawing Sheets

METHOD AND APPARATUS FOR MULTIPLEXING BROAD BAND HIGH FREQUENCY SIGNALS FOR USE IN NETWORK ANALYZERS

BACKGROUND OF THE INVENTION

1. Field of the Invention

The present invention relates to a method and apparatus for multiplexing broad band high frequency signals in general and in particular to a method and apparatus for multiplexing broad band high frequency signals in a network analyzer.

2. Description of the Prior Art

A network analyzer is an apparatus used for analyzing the electrical characteristics and performance of electrical networks and components thereof at various frequencies. In the analyzer, a network or component being analyzed is called a device under test or DUT. The signals transmitted through the DUT and/or reflected from the DUT are measured against a reference signal. The resulting ratios, i.e. S parameters, are a measure of the DUT's performance over the frequency range(s) of the signals applied thereto. The frequencies applied to a DUT may range from DC to over 60 gigaHertz 60 GHz depending on the type of network or component being analyzed.

To facilitate the testing of broad band devices, signals over a wide range of frequencies are typically generated by means of a plurality of signal generators, each of which provides a signal having a predetermined range of frequencies, e.g. 0.01-8 GHz, 8-20 GHz, 20-26 GHz, etc. When a plurality of such signal generators is used, the outputs of the signal generators are multiplexed, i.e. combined. Heretofore, it has been the practice to combine the outputs of the signal generators by means of a resistor network or some type of multithrow switch, e.g. an electro-mechanical or an electronic (PIN or FET) diode switch. However, each of these means has certain advantages and disadvantages.

An electro-mechanical switch has the advantage of producing low losses at high frequencies, but has the disadvantage of having a limited switching life and, therefore, is undesirable in a network analyzer requiring frequent switching between multiple frequency ranges. Electronic switches, on the other hand, have unlimited switching life, but have large insertion losses, e.g. 7-8 dB, at higher frequencies, e.g. 40 GHz. Since the output power of a signal generator at such high frequencies is typically quite low, the use of electronic switches at such frequencies is also undesirable.

SUMMARY OF THE INVENTION

In view of the foregoing, principal objects of the present invention are a method and apparatus for multiplexing broad band high frequency signals, e.g. 0.01-60 GHz, using a single section contra-directional microwave coupler.

A single section contra-directional microwave coupler is typically thought of as a narrow band device in that it is designed for coupling a predetermined amount of energy within a predetermined frequency band. The magnitude of the coupling depends on the construction of the device. For example, in one such device, known as a hybrid coupler the loss of signal strength through either the through-arm or the coupling arm, in addition to normal insertion loss, is approximately 3 dB. In another such coupler, which is not considered a hybrid, the loss of signal strength through the through-arm and the coupling arm, in addition to normal insertion loss, is approximately 6 dB and 1.5 dB, respectively.

While the conventional microwave coupler is typically thought of as a narrow band device, i.e. it is in fact a narrow band device only with respect to signals passing through its coupling arm. With respect to signals passing through its through-arm, the device may be considered a broad band device. This is because the loss of signal strength with respect to signals passing through the through-arm of the device decreases with decreasing frequency, approaching 0 dB as the frequency decreases toward DC.

The broad band characteristics of the through-arm and the limited losses in the coupling arm as described above are used to advantage in embodiments of the present invention.

In a first embodiment of the present invention there is provided a plurality of signal sources. The sources providing signals below a predetermined frequency, i.e. 40 GHz, are selectively coupled to the through-arm of a conventional hybrid microwave coupler by means of a PIN diode switch or the like. A source providing signals above said predetermined frequency, e.g. 40-60 GHz, is coupled to the coupling arm. In this embodiment, the coupler is designed for use in the 40-60 GHz band.

By using the 40-60 GHz coupler in the manner described, it is found that, relative to prior art combining techniques, there is a slight increase in the loss of signal strength below 40 GHz, i.e. 3 dB at 40 GHz and lesser values at lower frequencies. In contrast, above 40 GHz it is found that relative to prior art combining techniques, the use of a coupler significantly improves signal strength by restricting losses to 3 dB. That is, the maximum loss in signal strength, in addition to normal insertion losses, never exceeds 3 dB over the entire band of 0.01-60 GHz.

In another embodiment of the present invention a plurality of 40-60 GHz couplers are used in a network analyzer for multiplexing signals having frequencies in the range 0.01-40 GHz and the range 40-60 GHz. In this embodiment, the couplers are used for providing either 0.01-40 GHz signals or 40-60 GHz signals simultaneously at both a test signal port and a reference signal port. By using the couplers to take advantage of the broad band characteristics of their through-arms and the limited losses in their coupling arms, a significant increase in available signal strength is achieved over the entire 0.01-60 GHz range.

BRIEF DESCRIPTION OF THE DRAWINGS

The above and other objects, features and advantages of the present invention will become apparent from the following detailed description of the accompanying drawings, in which.

DETAILED DESCRIPTION OF THE INVENTION

Figure 1:
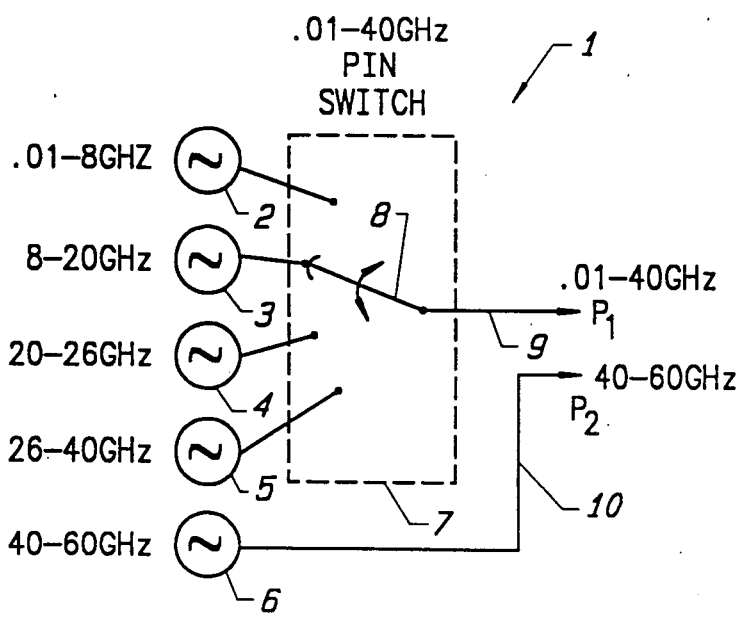
FIG. 1 is a block diagram of a prior art switching circuit showing the use of a PIN diode switch for multiplexing the outputs of a plurality of signal sources and the use of a separate source for providing a first signal having a frequency of 0.01-40 GHz and a second signal having a frequency of 40-60 GHz, respectively.
Figure 2:
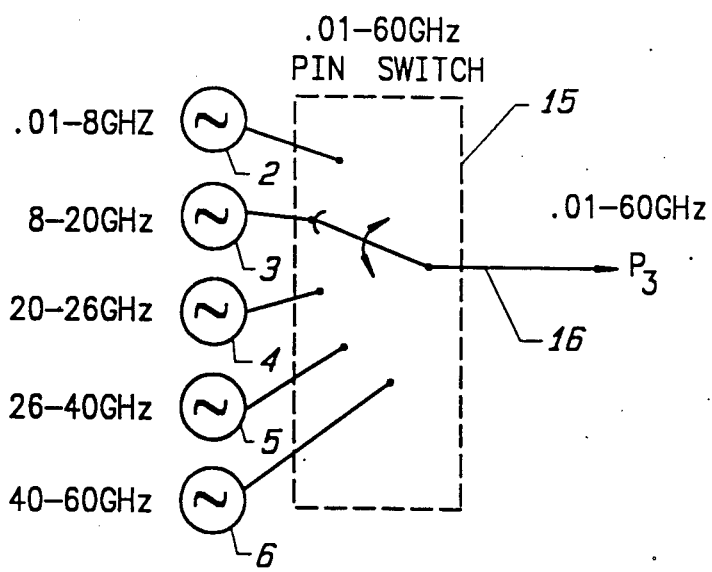
FIG. 2 is a block diagram of a prior art switching circuit showing all of the signal sources of FIG. 1 being multiplexed by means of a PIN diode switch for providing a signal having a frequency range of 0.01-60 GHz.
Figure 3:
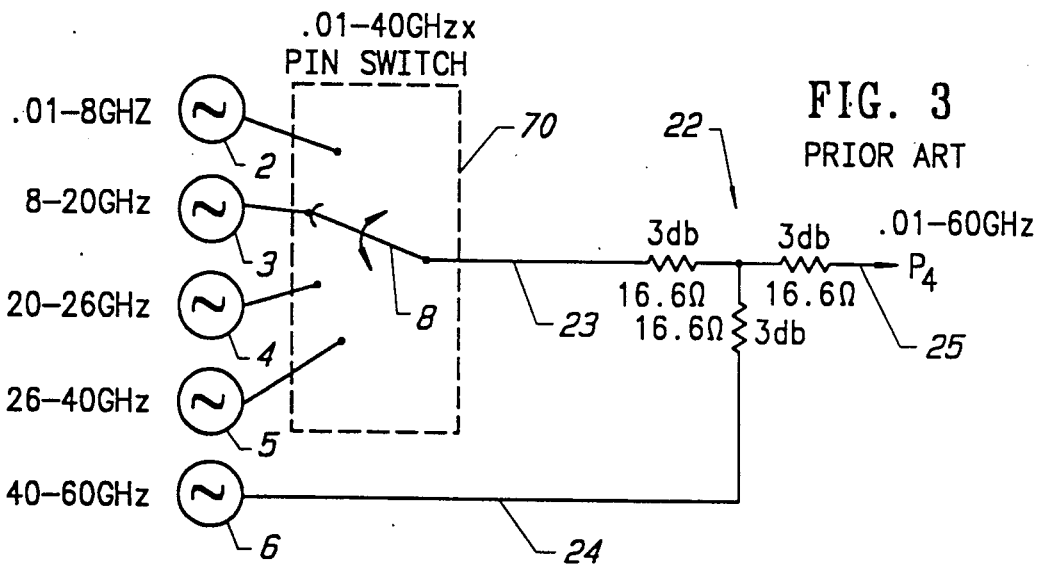
FIG. 3 is a block diagram of a prior art switching circuit wherein signals having a frequency of 0.01–40 GHz are multiplexed with a signal having a frequency of 40–60 GHz using a resistor network.

Referring to FIGS. 1, 2 and 3, there is shown three different prior art circuits for multiplexing a plurality of signals to provide an output signal having a frequency range of 0.01–60 GHz. In FIG. 1, there is provided a circuit designated generally as 1. In the circuit 1 there is provided a plurality of signal sources 2, 3, 4, 5 and 6. Signal source 2 provides a signal having a frequency range of 0.01–8 GHz. Source 3 provides a signal having a frequency range of 8–20 GHz. Source 4 provides a signal having a frequency range of 20–26 GHz. Source 5 provides a signal having a frequency range of 26–40 GHz. Source 6 provides a signal having a frequency range of 40–60 GHz. Signals from sources 2–5 are multiplexed by means of a conventional electronic PIN diode switch 7. While an electronic switch does not actually comprise a movable arm or pole, for purposes of explanation only, the PIN diode switch 7 is shown as having a movable arm or pole 8 for selectively connecting one of the sources 2–5 to an output connected to a line 9 for providing a signal P1 having a frequency range of 0.01–40 GHz. Coupled to the output of the source 6 there is provided a line 10 for providing a signal P2 having a frequency range of 40–60 GHz. Because the signals P1 and P2 are not provided on a single line, it would be necessary in practice to manually connect the lines 9 and 10 to a device in order to use the signals over the entire frequency range of 0.01–60 GHz.

Figure 6:
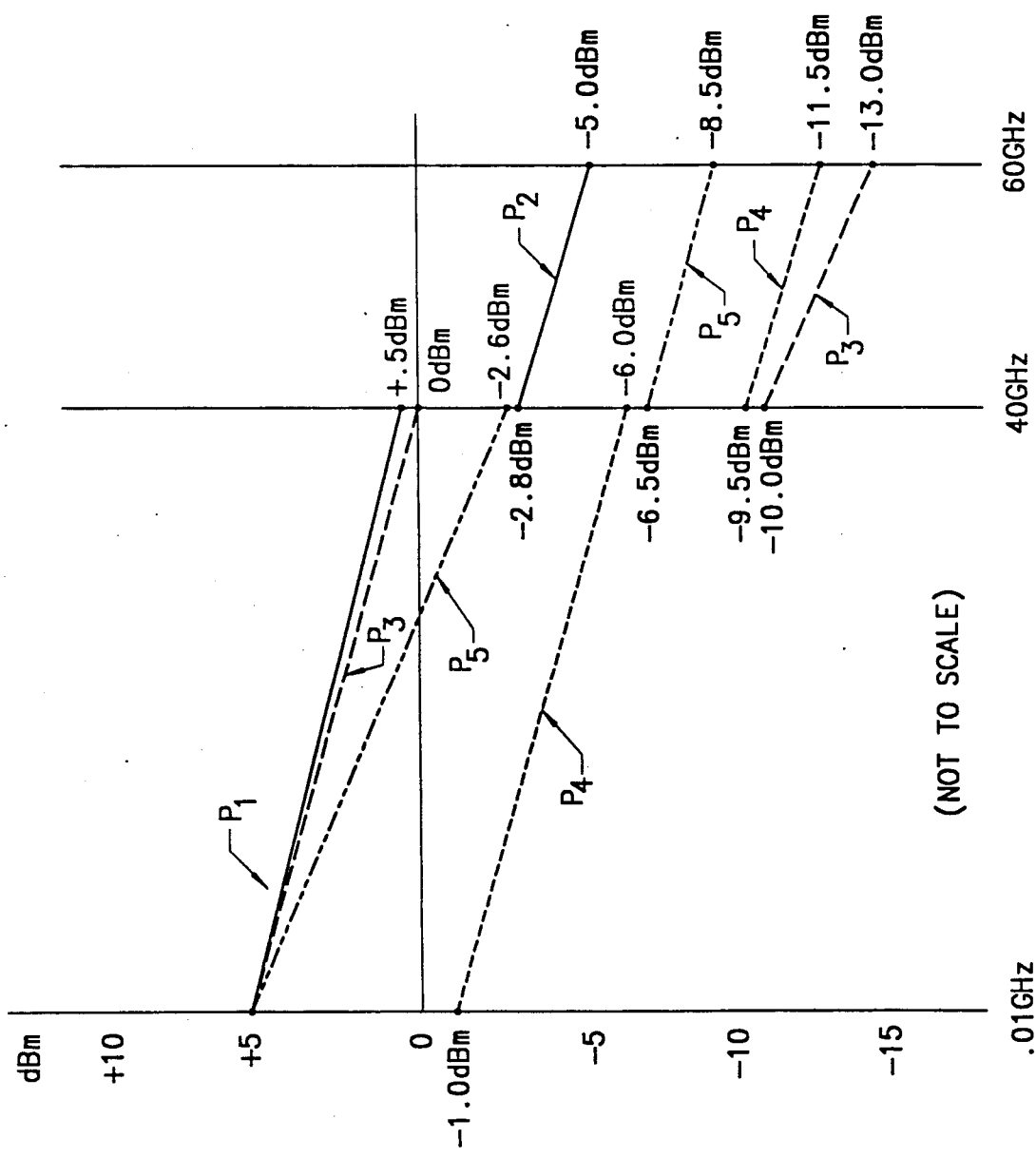
FIG. 6 is a chart of output power levels for the circuits of FIGS. 1–4.

Referring to FIG. 6, there is shown a diagram of the signal strength of the signals P1 and P2 for the frequencies 0.01–40 GHz and 40–60 GHz, respectively. As shown in FIG. 6, the insertion loss of the PIN diode switch 7 increases with increasing frequency such that the signal level of signal P1 decreases by approximately 4.5 dB from 0.01 GHz to 40 GHz. From 40 GHz to 60 GHz, the signal strength P2 decreases from approximately −3 dBm to −5 dBm. This is partially due to the fact that the power output of an oscillator typically decreases with increasing frequency.

Referring to FIG. 2, the signal sources 2–6 described above with respect to FIG. 1 are multiplexed using conventional PIN diode switch multiplexing techniques including a modified PIN diode switch designated generally as 15. By including the source 6 in the PIN diode switch 15, one is able to provide on an output line 16 a signal P3 having a frequency range of 0.01–60 GHz thereby eliminating the need for manually connecting the sources as described above with respect to FIG. 1. However, as will be noted, the addition of source 6 to the PIN diode switch 15 increases the insertion loss of the PIN diode switch 15, as shown more clearly in FIG. 6.

Referring to FIG. 6, it will be seen that the signal strength of the signal P3 over the frequency range 0.01–40 GHz is approximately 0.5 dB lower than the signal P1 of the apparatus of FIG. 1. More dramatically, the signal strength of the signal P3 over the frequency range 40–60 GHz is substantially lower than the signal P2. As seen in FIG. 6, when the PIN diode switch 15 couples the source 6 to the line 16, there is an immediate loss of signal strength of approximately 7.4 dB which increases to 8 dB at 60 GHz.

Referring to FIG. 3, there is shown still another method for multiplexing a plurality of signals. Using the same signal sources 2, 3, 4, 5 and 6 described above with respect to FIGS. 1 and 2, sources 2–5 are multiplexed using the 0.01–40 GHz PIN diode switch 7. The pole 8 of switch 7 is coupled to a first leg of a three-leg resistor network 22 by means of a line 23. The source 6 is coupled to a second leg of the resistor network 22 by means of a line 24. An output signal P4 having a frequency range of 0.01–60 GHz is provided on a line 25 extending from a third leg of the resistor network 22. Each of the legs in the resistor network 22 comprises a 16.6 ohm resistor providing a 3 dB attenuation for signals passing therethrough.

Referring to FIG. 6, it will be seen that the signal P4 has a level of approximately −1.0 dBm at 0.1 GHz and decreases to −6 dBm at 40 GHz. From 40–60 GHz the signal level of signal P4 decreases from approximately −9.5 dBm to approximately −11.5 dBm.

Figure 4:
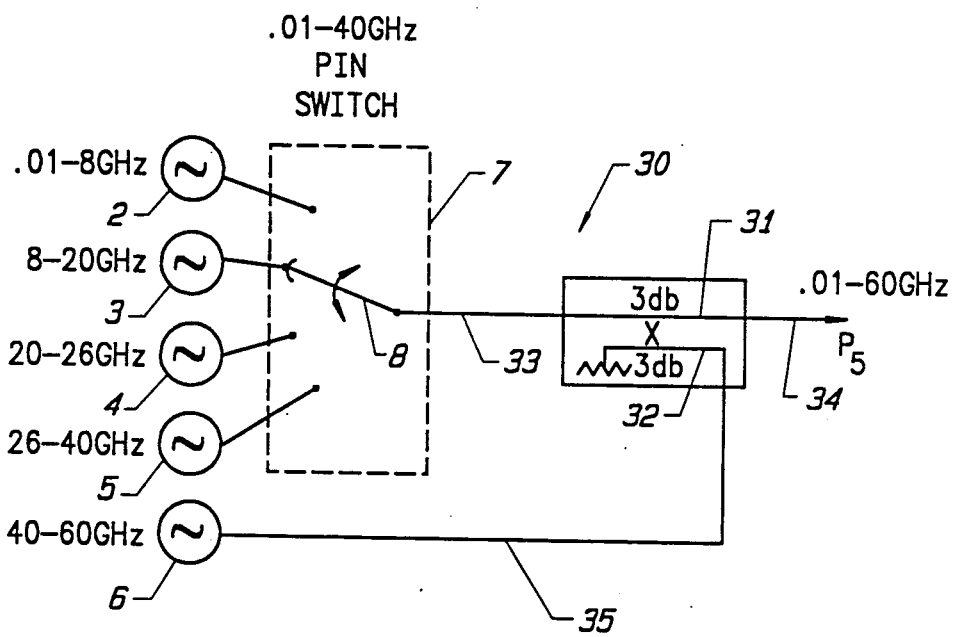
FIG. 4 comprises an embodiment of the present invention wherein signals having a frequency of 0.01–40 GHz are multiplexed with signals having a frequency of 40–60 GHz using a conventional microwave coupler.
Figure 5:
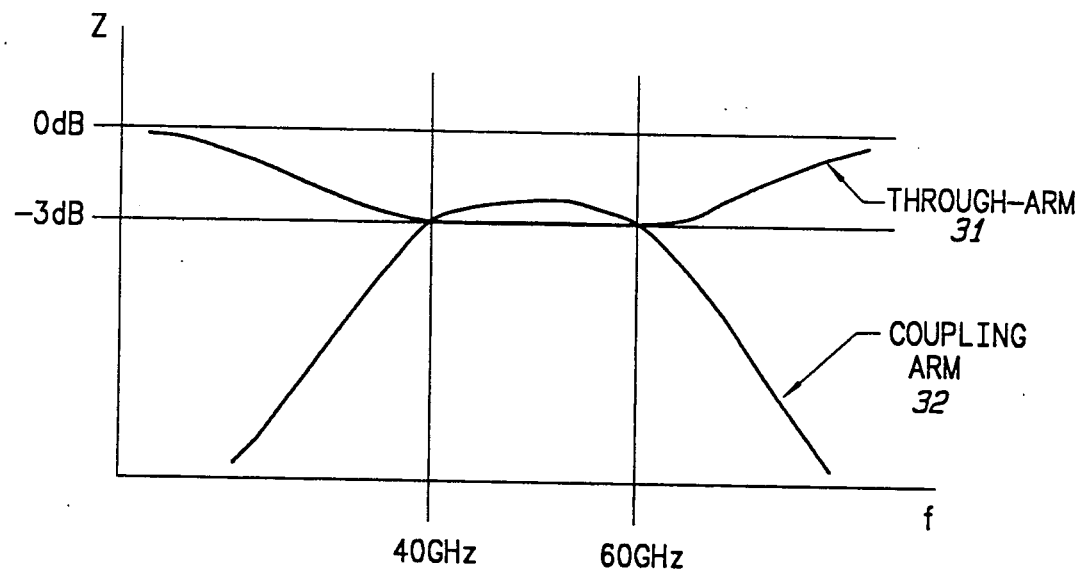
FIG. 5 is a drawing representing coupling (Z) vs. frequency (f) of the through-arm and coupling arm signal paths of the coupler of FIG. 4.

Referring to FIGS. 4 and 5, there is provided in accordance with the present invention an apparatus for multiplexing the signals from the sources 2, 3, 4, 5 and 6 using the 0.01–40 GHz PIN diode switch 7 of FIGS. 1 and 3 and a conventional microwave hybrid coupler designated generally as 30. In the coupler 30 there is provided a through-arm 31 and a coupling arm 32. The through-arm 31 is provided with an input coupled to the switch 7 by means of a line 33 and an output coupled to the line 34 for providing a signal P5 having a frequency range of 0.01–60 GHz. The coupling arm 32 is coupled to the source 6 by means of a line 35.

Referring to FIG. 5, over the frequency band of 40–60 GHz, the maximum attenuation of coupler 30, in addition to normal insertion losses, is approximately 3 dB. Microwave couplers such as coupler 30 are typically thought of as narrow band devices in that they are designed to operate over a particular band of frequencies, e.g. 40–60 GHz. On close inspection, however, it will be noticed that the narrow band characteristics of the coupler 30 are actually restricted to the signals passing through the coupling arm 32. In contrast, the attenuation of the signals passing through the through-arm 31 actually decreases with decreasing frequency.

Referring to FIG. 6, it will be seen that the strength of the signal P5 decreases somewhat more rapidly than the signal strength of signals P1 and P3 of the embodiment of FIGS. 1 and 2 over the range of frequencies 0.01-40 GHz. In contrast, the signal strength of P5 is considerably greater than the signal strength of signals P3 and P4 over the range of frequencies 40-60 GHz. That is to say, in exchange for a slightly greater loss of signal strength over the frequency range 0.01-40 GHz, the apparatus of the present invention provides a considerably greater signal strength over the range of 40-60 GHz, as shown by the signal level P5 of FIG. 6.

Figure 7:
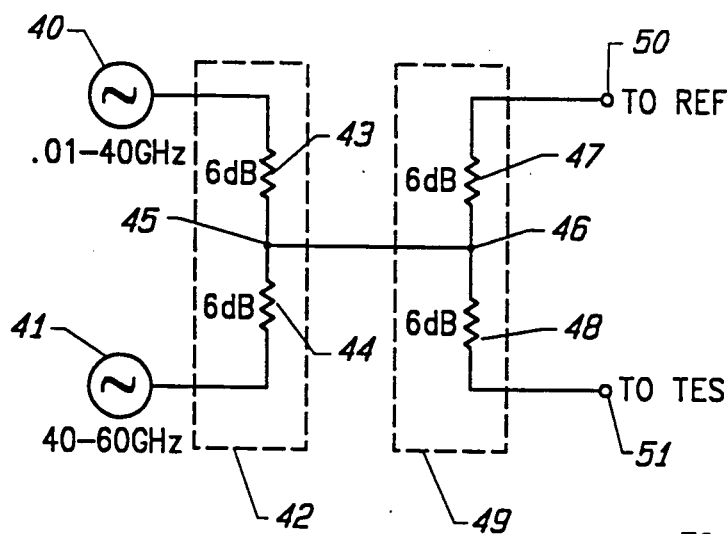
FIG. 7 is a typical prior art resistor circuit used for providing 0.01–40 GHz signals and 40–60 GHz signals to a reference signal port and to a test signal port in a network analyzer.

Referring to FIG. 7, there is provided in a prior art resistor circuit a pair of signal sources 40 and 41. Source 40 provides a signal having a frequency range of 0.01-40 GHz. Source 41 provides a signal having a frequency range of 40-60 GHz. Sources 40 and 41 are coupled to a resistive signal combiner 42 comprising a pair of resistors 43 and 44. A node 45 between the resistors 43 and 44 is coupled to a node 46 located between a comparable set of resistors 47 and 48 in a power splitter designated generally as 49. The resistor 47 is coupled to a reference signal port 50. Resistor 48 is coupled to a test signal port 51.

In operation, signals from either signal source 40 or signal source 41 are applied to reference signal port 50 and test signal port 51 by means of the combiner 42 and splitter 49. As shown by the 6 dB designations adjacent each of the resistors 43, 44, 47 and 48, there is a significant loss of signal between the sources 40 and 41 and the reference signal port 50 and test signal port 51 using the combiner 42 and splitter 49.

Figure 8:
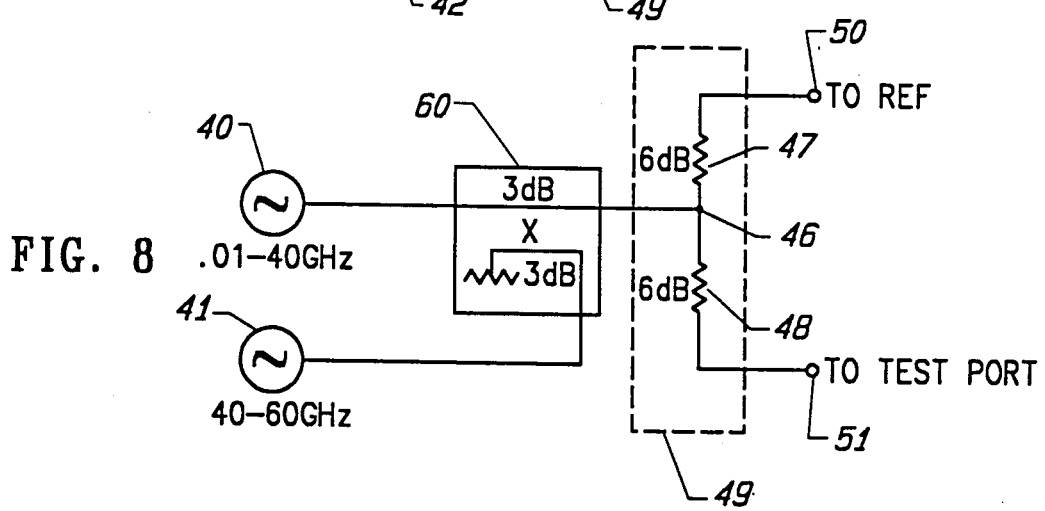
FIG. 8 is an embodiment of the present invention in which a 0.01–40 GHz signal and a 40–60 GHz signal are multiplexed by means of a microwave coupler to provide a 0.01–40 GHz signal and a 40–60 GHz signal on a reference signal port and a test signal port in a network analyzer.

Referring to FIG. 8, to reduce the signal loss described above with respect to the apparatus of FIG. 7, the combiner 42 is replaced by means of a hybrid microwave coupler 60 as described above with respect to FIG. 4. Because the maximum signal loss in combiner 60 is, in addition to a normal insertion loss, limited to 3 dB, the use of the combiner 60 provides an immediate improvement in signal strength over that available in the apparatus of FIG. 7.

Figure 9:
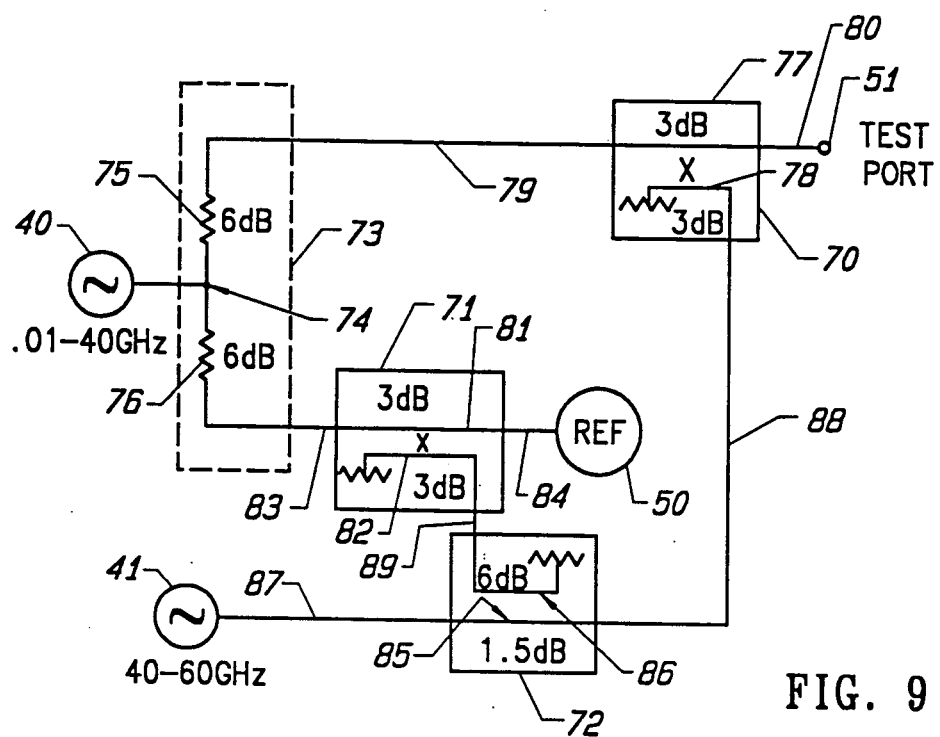
FIG. 9 is another embodiment of the present invention in which a 0.01–40 GHz signal and a 40–60 GHz signal are multiplexed using a plurality of microwave couplers for providing a 0.01–40 GHz signal and a 40–60 GHz signal on a test signal port and a reference signal port in a network analzyer.

Referring to FIG. 9, there is provided in still another embodiment of the present invention an apparatus for providing a signal on the test signal port 51 and the reference signal port 50 using a plurality of microwave couplers 70, 71 and 72 and a power splitter 73. The source 40 is coupled to a node 74 located between a pair of resistors 75 and 76 in the splitter 73.

In the first coupler 70 there is provided a through-arm 77 and a coupling arm 78. The input of through-arm 77 is coupled to the resistor 75 by means of a signal line 79. The output of the through-arm 77 is coupled to the test signal port 51 by means of a signal line 80.

In the coupler 71 there is provided a through-arm 81 and a coupling arm 82. The input of the through-arm 81 is coupled to the resistor 76 by means of a signal line 83. The output of the through-arm 81 is coupled to the reference signal port 50 by means of a signal line 84.

In the coupler 72 there is provided a through-arm 85 and a coupling arm 86. The input of the through-arm 85 is coupled to the source 41 by means of a signal line 87. The output of the through-arm 85 is coupled to the coupling arm 78 in the coupler 70 by means of a signal line 88. The coupling arm 86 in the coupler 72 is coupled to the coupling arm 82 in the coupler 71 by means of a signal line 89.

The couplers 70 and 71 are conventional hybrid couplers providing a 3 dB loss of signal with respect to signals passing through the coupler via either the through-arm 77 or the coupling arm 78. Coupler 72, on the other hand, is not considered to be a hybrid coupler and has a 6 dB attenuation with respect to signals passing through the coupling arm and a 1.5 dB attenuation with respect to signals passing through the through-arm 85. The 6 dB attentation was chosen to provide a reasonably strong signal to the reference signal port and simultaneously have as small a loss as possible to the test signal port. Other values could also be used.

Recalling that the power output of high frequency signal sources decreases with increasing signal frequency, it is important that the attenuation of the signals from the source 41 be kept at a minimum. This is particularly true with respect to signals from the source 41 at the test signal port 51.

As shown in FIG. 9, there is provided adjacent to each of the arms in the couplers 70, 71 and 72 an indication of the amount of attenuation encountered by signals passing therethrough. For example, a signal passing through the through-arm 77 of the coupler 70 will experience a 3 dB loss in signal level whereas a signal passing through the through-arm 85 in the coupler 72 will experience a 1.5 dB loss in signal level. Similarly, a signal passing through the coupling arm 82 of the coupler 71 will experience a 3 dB loss in signal level whereas a signal passing through the coupling arm 86 of the coupler 72 will experience a 6 dB loss in signal level. Thus, when the source 40 is coupled to the test signal port 51 and the reference signal port 50, the signal levels at each of these ports is reduced by approximately 9 dB. When the source 41 is coupled to the test signal port 50 and the reference signal port 51, the signal levels of the signals transmitted between the source 41 to the reference signal port 50 via the coupling arms 86 and 82 are also reduced by 9 dB. However, in contrast thereto, when the signals from the source 41 are applied to the test signal port 51 they undergo only a 4.5 dB loss in signal strength. This reduced attenuation of the signal more than compensates for the reduced power output of the source 41 at the higher frequencies.

With respect to each of the circuits described above, it will be understood that appropriate controls and terminations (which have been omitted for clarity) are normally provided for controlling each of the signal sources such that the signals from only one source at a time are applied to the couplers in the present invention.

While several embodiments of the present invention are described above, it is contemplated that various modifications may be made thereto without departing from the spirit and scope of the present invention. For example, coupler 72 in FIG. 9 need not be a contra-directional coupler, but can be any other type of coupler designed for coupling signals over a narrow band, e.g. a branch line coupler. Accordingly, it is intended that the embodiments described be considered only as illustrative of the present invention and that the scope thereof should not be limited thereto but be determined by reference to the claims hereinafter provided.

What is claimed is:

1. An apparatus for multiplexing a plurality of high frequency signals consisting of a plurality of substantially non-overlapping ranges of frequencies, comprising:

a single section contra-directional coupler, said coupler having a through-arm and a coupling arm, said through-arm having an input and an output and being operative over a frequency band which substantially extends over said plurality of ranges of frequencies, and said coupling arm having an input;

first means for selectively coupling said signals consisting of a first one of said plurality of ranges of frequencies to said input of said through-arm, said first one of said plurality of ranges of frequencies comprising frequencies generally below a predetermined frequency which extend over multiple decades relative to a lowest frequency therein; and second means for selectively coupling said signals consisting of a second one of said plurality of ranges of frequencies to said input of said coupling arm, said second one of said plurality of ranges of frequencies comprising frequencies generally above said predetermined frequency within an octave relative to a lowest frequency therein, said output of said through-arm providing an output signal having a frequency within said first one of said plurality of ranges of frequencies when said first one of said plurality of ranges of frequencies is selectively coupled to said input of said through-arm and an output signal having a frequency within said second one of said plurality of ranges of frequencies when said second one of said plurality of ranges of frequencies is selectively coupled to said input of said coupling arm.

2. An apparatus according to claim 1 wherein said coupler comprises a hybrid coupler for providing to said output signal on said output of said through-arm, in addition to a loss of signal strength due to insertion loss, a maximum of approximately a 3 dB loss of signal strength with respect to said signals provided to each of the inputs of said through and coupling arms.

3. An apparatus according to claim 1 wherein said first one of said plurality of ranges of frequencies generally comprises frequencies of less than 40 GHz and said second one of said plurality of ranges of frequencies generally comprises frequencies greater than 40 GHz.

4. An apparatus for multiplexing a plurality of high frequency signals consisting of a plurality of generally non-overlapping ranges of frequencies, comprising:

a single section contra-directional coupler, said coupler having a through-arm and a coupling arm, said through-arm having an input and an output and being operative over a frequency band which substantially extends over said plurality of ranges of frequencies, and said coupling arm having an input;

first means for selectively coupling said signals consisting of a first one of said plurality of ranges of frequencies to said input of said through-arm, said first one of said plurality of ranges of frequencies comprising frequencies generally below a predetermined frequency which extend over multiple decades relative to a lowest frequency therein, said first means comprising switching means for selectively coupling said input of said through-arm to one of a plurality of signal sources having a frequency within said first one of said plurality of ranges of frequencies; and second means for selectively coupling said signals consisting of a second one of said plurality of ranges of frequencies to said input of said coupling arm, said output of said through-arm providing an output signal having a frequency within said first one of said plurality of ranges of frequencies when said signals consisting of said first range of frequencies is selectively coupled to said through-arm and an output signal having a frequency within said second one of said plurality of ranges of frequencies when said signals consisting of said second range of frequencies is selectively coupled to said coupling arm.

5. An apparatus according to claim 4 wherein said switching means comprises a PIN diode switching means.

6. An apparatus according to claim 4 wherein said coupler comprises a hybrid coupler for providing to said output signal on said output of said through-arm, in addition to a loss of signal strength due to insertion loss, a maximum of approximately a 3 dB loss of signal strength with respect to said signals provided to each of the inputs of said through and coupling arms.

7. An apparatus according to claim 4 wherein said first predetermined range of frequencies generally comprises frequencies of less than 40 GHz and said second predetermined range of frequencies generally comprises frequencies greater than 40 GHz.

8. An apparatus for providing a plurality of signals at a test signal port and a reference signal port, each of said signals having a predetermined range of frequencies, comprising:

a resistive power splitter having in series a first and a second resistive leg;

a first coupler having a through-arm and a coupling arm, said through-arm of said first coupler having an input and an output and said coupling arm of said first coupler having an input;

a second coupler having a through-arm and a coupling arm, said through-arm of said second coupler having an input and an output and said coupling arm of said second coupler having an input;

a third coupler having a through-arm and a coupling arm, said through-arm of said third coupler having an input and an output and said coupling arm of said third coupler having an output;

means for coupling a first one of said plurality of signals having a first predetermined range of frequencies to a node between said first and said second legs of said resistive power splitter;

means for coupling said input and said output of said through-arm of said first coupler to said first leg of said resistive power splitter and said test signal port, respectively;

means for coupling said input and said output of said through-arm of said second coupler to said second leg of said resistive power splitter and said reference signal port, respectively;

means for coupling said input and said output of said through-arm of said third coupler to a second one of said plurality of said signals having a second predetermined range of frequencies and to said input of said coupling arm of said first coupler, respectively; and means for coupling said output of said coupling arm of said third coupler to said input of said coupling arm of said second coupler.

9. An apparatus according to claim 8 wherein said first and said second couplers provide, in addition to an insertion loss, a maximum loss of approximately 3 dB in signal strength with respect to signals applied to their through and coupling arms and said third coupler provides, in addition to an insertion loss, a maximum loss of approximately 6 dB in signal strength with respect to a signal applied to its coupling arm and a 1.5 dB loss in signal strength with respect to a signal applied to said input of its through-arm.

10. A method of multiplexing a plurality of high frequency signals using a single section contra-directional coupler comprising a through-arm having an input and an output and a coupling arm having an input, said signals consisting of a plurality of substantially non-overlapping ranges of frequencies, said through arm being operative over a frequency band which substantially extends over said plurality of ranges of frequencies, comprising the steps of:

selectively providing signals having a frequency within a first one of said plurality of ranges of frequencies to the input of the through-arm in said single section contra-directional coupler, said first predetermined range of frequencies comprising frequencies generally below a predetermined frequency which extend over multiple decades relative to a lowest frequency therein; and selectively providing signals having a frequency within a second one of said plurality of ranges of frequencies generally above said predetermined frequency to the input of said coupling arm in said coupler for providing on the output of said through-arm an output signal having a frequency within at least one of said first and said second predetermined ranges of frequencies.

11. A method according to claim 10 wherein said step of providing signals within said first one of said plurality of ranges of frequencies comprises the step of selectively coupling said input of said through-arm to one of a plurality of signal sources having a frequency within said one of said plurality of ranges of frequencies.

12. A method according to claim 10 wherein said step of providing said output signal on said output of said through-arm comprises the step of providing said output signal with, in addition to a loss of signal strength due to insertion loss, a maximum of approximately a 3 dB loss of signal strength with respect to said signals provided to each of said through and coupling arms.

13. A method according to claim 10 wherein said first one of said plurality of ranges of frequencies generally comprises frequencies of less than 40 GHz and said second one of said plurality of ranges of frequencies generally comprises frequencies greater than 40 GHz.

* * * * *